(12) United States Patent
Fetzer et al.

(10) Patent No.: US 7,807,921 B2
(45) Date of Patent: Oct. 5, 2010

(54) MULTIJUNCTION SOLAR CELL HAVING A LATTICE MISMATCHED GRIII-GRV-X LAYER AND A COMPOSITION-GRADED BUFFER LAYER

(75) Inventors: Christopher M. Fetzer, Saugus, CA (US); Richard R. King, Thousand Oaks, CA (US); Peter C. Colter, Canyon Country, CA (US)

(73) Assignee: The Boeing Company, Chicago, IL (US)

( * ) Notice: Subject to any disclaimer, the term of this patent is extended or adjusted under 35 U.S.C. 154(b) by 715 days.

(21) Appl. No.: 10/868,079

(22) Filed: Jun. 15, 2004

(65) Prior Publication Data

US 2005/0274409 A1 Dec. 15, 2005

(51) Int. Cl.
*H01L 31/00* (2006.01)
(52) U.S. Cl. .................. 136/262; 136/261; 136/255
(58) Field of Classification Search ............... 136/243, 136/261; 372/43
See application file for complete search history.

(56) References Cited

U.S. PATENT DOCUMENTS

| | | | |
|---|---|---|---|
| 5,223,043 A | | 6/1993 | Olson et al. |
| 5,383,211 A | * | 1/1995 | Van de Walle et al. ... 372/43.01 |
| 5,689,123 A | | 11/1997 | Major et al. |
| 6,100,546 A | | 8/2000 | Major et al. |
| 6,130,147 A | | 10/2000 | Major et al. |
| 6,255,580 B1 | | 7/2001 | Karam et al. |
| 6,281,426 B1 | * | 8/2001 | Olson et al. .................. 136/249 |
| 6,316,715 B1 | | 11/2001 | King et al. |
| 6,340,788 B1 | * | 1/2002 | King et al. .................. 136/261 |
| 6,660,928 B1 | | 12/2003 | Patton et al. |
| 2002/0117675 A1 | * | 8/2002 | Mascarenhas ................ 257/87 |
| 2002/0121674 A1 | * | 9/2002 | Welser et al. ............... 257/530 |
| 2004/0065363 A1 | | 4/2004 | Fetzer et al. |
| 2004/0079408 A1 | | 4/2004 | Fetzer et al. |
| 2004/0166681 A1 | * | 8/2004 | Iles et al. .................... 438/689 |

\* cited by examiner

*Primary Examiner*—Alexa D. Neckel
*Assistant Examiner*—Miriam Berdichevsky
(74) *Attorney, Agent, or Firm*—McNees Wallace & Nurick, LLC

(57) ABSTRACT

A multijunction solar cell includes a first photoactive subcell layer having a first-subcell lattice parameter and a composition including (a) at least one Group III element, at least one Group V element other than (nitrogen, phosphorus), and (nitrogen, phosphorus), or (b) a material selected from the group including GaInAsBi, GaInAsSb, GaInAsP, $ZnGeAs_2$, or BGaInAs. The multijunction solar cell also has a substrate having a substrate lattice parameter different from the first-subcell lattice parameter, and a composition-graded buffer layer between the first photoactive subcell layer and the substrate and having a buffer-layer lattice parameter graded between the first-subcell lattice parameter and the substrate lattice parameter. The substrate may be a second photoactive subcell layer having a second-subcell lattice parameter different from the first-subcell lattice parameter and sensitive to a second-photoactive-subcell-layer wavelength, and the buffer layer is transparent to the second-photoactive-subcell-layer wavelength.

14 Claims, 2 Drawing Sheets

MULTIJUNCTION SOLAR CELL HAVING A LATTICE MISMATCHED GRIII-GRV-X LAYER AND A COMPOSITION-GRADED BUFFER LAYER

This invention was made with Government support under Contract No. F29601-98-2-0207 awarded by the United States Air Force. The Government has certain rights in this invention.

This invention relates to solar cells and, more particularly, to a multijunction solar cell.

BACKGROUND OF THE INVENTION

A solar cell is a photovoltaic (PV) device having one or more photovoltaic junctions. Each junction is formed by a photovoltaic semiconductor layer. At each junction, incident light energy, and specifically solar energy, is converted to electrical energy through the photovoltaic effect.

The interest in solar cells has been increasing due to concerns regarding pollution and limited available resources. This interest has been for both terrestrial and non-terrestrial applications. In space applications, the use of nuclear or battery power greatly increases a spacecraft's payload for a given amount of required power to operate the satellite. Increasing the payload of a spacecraft in this manner increases the cost of a launch more than linearly. With the ready availability of solar energy in space for a spacecraft such as a satellite, the conversion of solar energy into electrical energy may be a good alternative to an increased payload.

The cost per watt of electrical power generation capacity of photovoltaic systems inhibits their widespread use in terrestrial applications. The conversion efficiency of sunlight to electricity may be critically important for terrestrial PV systems, since increased efficiency usually results in a reduction of related electricity generation system components (such as cell area, module or collector area, support structures, and land area) for a required power output of the system. For example, in concentrator solar cell systems which concentrate sunlight from around 2 to around 2000 times onto the solar cell, an increase in efficiency typically results in a proportionate reduction of an area comprising expensive concentrating optics.

To increase the electrical power output of such cells, multiple subcells or layers having different energy bandgaps have been stacked so that each subcell or layer can absorb a different part of the wide energy distribution in the sunlight. This arrangement is advantageous, since each photon absorbed in a subcell corresponds to one unit of charge that is collected at the subcell operating voltage, which is approximately linearly dependent upon the band gap of the semiconductor material of the subcell. Since the output power is the product of voltage and current, an ideally efficient solar cell would have a large number of subcells, each absorbing only photons of energy negligibly greater than its band gap.

The most efficient and therefore dominant multi unction (MJ) PV cell technology is the GaInP/Ga(In)As/Ge cell structure. Here the use of parentheses in the Ga(In)As middle subcell material indicates that the incorporation of indium in the middle cell is optional, so that the composition of the middle cell may be either GaAs or GaInAs. These monolithic cells may be grown lattice-matched to GaAs or Ge, and may have only the top two junctions active with an inactive Ge substrate (2-junction or 2J cells), or all three junctions may be active (3-junction or 3J cells). While variations on this material system, such as AlGaInP or lattice-mismatched GaInP top cells, might provide a more ideal match of band gaps to the solar spectrum, practical considerations have indicated that lattice-matched GaInP is preferred for large-scale production.

In monolithic, series-interconnected, 2-junction and 3-junction GaInP/Ga(In)As/Ge solar cells, it is desirable for the GaInP top subcell to have nearly the same photogenerated current density as the Ga(In)As subcell. If the currents are different, the subcell with the lowest photogenerated current will limit the current through all of the series-interconnected subcells in the multijunction (MJ) cell, and excess photogenerated current in other subcells is wasted. Limiting the current in this manner results in a severe penalty on the MJ cell efficiency.

At the lattice constant of Ge (or of GaAs) substrates, GaInP grown under conventional conditions has an ordered group-III sublattice and therefore has a band gap which is too low to achieve the desired current match between subcells in the unconcentrated or concentrated AM0 space solar spectrum, the unconcentrated or concentrated AM1.5D and AM1.5G terrestrial solar spectra, and other solar spectra, unless the top subcell is purposely made optically thin, as in U.S. Pat. No. 5,223,043.

Whether in the multiple-junction or single-junction PV device, a conventional characteristic of PV cells has been the use of a window layer on an emitter layer disposed on the base of the PV cell. The primary function of the window layer is to reduce minority-carrier recombination (i.e., to passivate) the front surface of the emitter. Additionally, the optical properties of the window material must be such that as much light as possible is transmitted to lower cell layers where the photogenerated charge carriers can be collected more efficiently, or if there is substantial light absorption in the window, the minority-carrier lifetime in the window must be sufficiently long for the carriers to be collected efficiently at the p-n junction between the emitter and base of the PV cell; Similarly, a back-surface field (BSF) structure below the PV cell base has been used to reduce minority-carrier recombination at the back surface of the base. As for the window, the BSF structure (referred to here simply as a BSF, for brevity) must have optical properties which allow most of the light that can be used by the subcells beneath the BSF to be transmitted by the BSF, and/or the minority-carrier properties in the BSF must be such that electrons and holes which are generated by light absorption in the BSF are efficiently collected at the p-n junction of the PV cell.

For the multiple-subcell PV device, the efficiency may be limited by the requirement of low-resistance interfaces between the individual cells to enable the generated current to flow from one cell to the next. Accordingly, in a monolithic structure, tunnel junctions have been used to minimize the blockage of current flow. In addition to providing the lowest resistance path possible between adjacent subcells, the tunnel junction should also be transparent to wavelengths of light that can be used by lower subcells in the MJ stack, because of the poor collection efficiency of carriers photogenerated in the tunnel junction region.

These properties are all dependent on the bandgap, doping levels, optical properties, and minority-carrier recombination and diffusion properties of the base, emitter, window, BSF, and tunnel junction layers employed in the device. The semiconductor properties of these cell layers may be enhanced or degraded for a MJ PV device by the choice of substrate orientation.

There exists a need for multijunction solar (photovoltaic) cells with improved power output, efficiency, performance, and cost effectiveness.

SUMMARY OF THE INVENTION

One potential approach to improving the existing triple-junction GaInP/Ga(In)As/Ge multijunction solar cell device is to add one or more additional junctions. In a specific case, a junction with an active-layer band gap of approximately 1.0 eV is inserted between the Ga(In)As and Ge active subcells. See U.S. Pat. Nos. 5,689,123; 6,281,426; 6,100,546; and 6,130,147, all of which are incorporated by reference. The layered combination GaInP/Ga(In)As/1.0 eV subcell/Ge is an example of a four-junction or 4J device. The 1.0 eV band gap subcell material is substantially lattice matched; that is, it has a lattice parameter exactly or near exactly that of the underlying and overlying subcell materials. The subcell containing the 1.0 eV material is as described above, including the window, the emitter, the base BSF, and the tunnel junctions. U.S. Pat. No. 6,316,715, which is incorporated by reference, discusses the methodology of incorporating additional junctions to form more-complex five-junction (5J) and six junction (6J) devices.

A limitation in the existing 4J, 5J, and 6J devices (and cells with even more junctions) is the requirement of nearly perfect lattice matching of the inserted subcell and the underlying and overlying materials. Any substantial deviation, such as more than about +/−0.1 percent difference in lattice parameter, without proper design to incorporate the change in lattice parameter, will result in degradation of the overall efficiency of the solar cell. Another limitation is the reliance on the GaInAsN alloy lattice-matched to the GaAs or Ge layers. The lattice-matched GaInAsN material has poor quality when produced by available techniques. The problem results from the need to incorporate a large amount of nitrogen to achieve the 1.0 eV band gap and the lattice-matched condition simultaneously.

The present invention provides a design approach for a multijunction solar cell in which the performance for high conversion efficiency and producibility are both optimized. The problems associated with the lattice-matched GaInAsN (or similar) material having a band gap near to 1.0 eV are overcome.

In accordance with the invention, a multijunction solar cell comprises a first photoactive subcell layer having a first-subcell lattice parameter and a composition comprising (a) at least one Group III element, at least one Group V element other than (nitrogen, phosphorus), and (nitrogen, phosphorus), or (b) a material selected from the group consisting of GaInAsBi, GaInAsSb, GaInAsP, ZnGeAs$_2$, and BGaInAs. The multijunction solar cell further has a substrate having a substrate lattice parameter different from the first-subcell lattice parameter. A composition-graded buffer layer lies between the first photoactive subcell layer and the substrate and has a buffer-layer lattice parameter graded between the first-subcell lattice parameter and the substrate lattice parameter. As used herein, the terminology "(nitrogen, phosphorus)" or "(N,P)" means nitrogen or phosphorus or a combination thereof.

The composition of the composition-graded buffer layer may be, at least in part, stepwise graded, or it may be, at least in part, continuously graded. The substrate may be a second photoactive subcell layer having a second-subcell lattice parameter different from the first-subcell lattice parameter and sensitive to a second-photoactive-subcell-layer wavelength. In this case, the buffer layer is transparent to light of the second-photoactive-subcell-layer wavelength. The substrate may instead be a non-photoactive material.

In a preferred application, the first photoactive subcell layer may have a bandgap of from about 0.7 to about 1.4 eV (electron volt), and more specifically of from about 0.9 to about 1.1 eV. Preferably, in the first subcell layer the at least one Group III element comprises gallium and indium, and the at least one Group V element other than (nitrogen, phosphorus) comprises arsenic. More preferably, the first subcell layer has a composition comprising gallium, indium, arsenic, and nitrogen, wherein indium is present in the first photoactive subcell layer in an amount greater than 7 atom percent and less than 32 atom percent, and nitrogen is present in the first photoactive subcell layer in an amount greater than 0 and less than 2.5 atom percent.

In this most preferred application, the composition relations are such that $$\% \, In(a_0, E_g) = \alpha_{In} a_0 + \beta_{In} E_g + \gamma_{In} \text{ and}$$

$$\% \, N(a_0, E_g) = \alpha_N a_0 + \beta_N E_g + \gamma_N,$$

% In and % N are in percentages, the lattice parameter $a_0$ is in Angstroms, and the bandgap $E_g$ is in electron volts. The applicable approximate coefficients for the GaInAsN alloy are $\alpha_{In} = 192.72$, $\beta_{In} = -15.41$, $\gamma_{In} = -1067.60$, $\alpha_N = -20.21$, $\beta_N = -6.12$, $\gamma_N = 122.88$.

Stated more generally for this preferred approach, the first photoactive subcell layer has a composition $(GrIII)_{1-X}(In)_X(GrV)_{1-Y}N_Y$, wherein X is greater than 7 atom percent and less than 32 atom percent, and Y is greater than 0 and less than 2.5 atom percent, wherein X and Y are associated with the same lattice parameter of the $(GrIII)_{1-X}In_X(GrIV)_{1-Y}N_Y$ composition when separately present in $(GrIII)_{1-X}In_X(GrIV)_{1-Y}N_Y$. As used herein, the notation GrIII refers to an element in group III of the periodic table, and GrV refers to an element in group V of the periodic table.

There may be at least one additional photoactive subcell layer overlying the first photoactive subcell layer. Thus, in one preferred application, a multijunction solar cell comprises a Ge substrate, a composition-graded buffer layer comprising GaInAs overlying and contacting the Ge substrate, a lattice-mismatched layer comprising GaInAsN overlying and contacting the composition-graded buffer layer comprising GaInAs, a composition-graded buffer layer comprising GaInAs overlying and contacting the a lattice-mismatched layer comprising GaInAsN, a layer comprising Ga(In)As overlying and contacting the composition-graded buffer layer comprising GaInAs, and a layer comprising GaInP overlying and contacting the layer comprising Ga(In)As.

The present approach achieves the benefits of the GaInAsN (or similar GrIII-GrV-(N,P)) material while avoiding the limitations imposed by requiring that it be lattice matched to the underlying substrate or other material. The composition-graded buffer layer lying between the GaInAsN layer and its underlying material layer allows the GaInAsN layer to be optimized in performance without regard to lattice matching. The presence of the composition-graded buffer layer then permits the GaInAsN to be deposited in a controlled, robust manner. The composition-graded buffer layer does absorb some light energy and may produce defect structures in some circumstances, and the buffer layer is therefore used only where its advantages outweigh such disadvantages.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
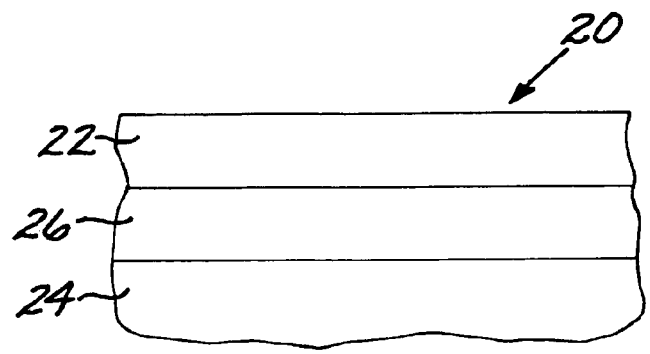
FIG. 1 is a schematic elevational view of a first embodiment of the multijunction solar cell of the present invention.

FIG. 1 depicts a multijunction solar cell 20 having a first photoactive subcell layer 22 with a first-subcell lattice parameter and a composition comprising at least one Group III element, at least one Group V element other than (nitrogen, phosphorus), and (nitrogen, phosphorus). As used herein, the notation "(nitrogen, phosphorus)" or "(N,P)" means nitrogen or phosphorus or a combination thereof. For applications to be discussed subsequently, the first photoactive subcell layer 22 has a bandgap of from 0.7 to 1.4 eV, more preferably from 0.9 to 1.1 eV, and most preferably about 1.0 eV. Preferably, the at least one Group III element comprises gallium and indium, and the at least one Group V element other than (nitrogen, phosphorus) comprises arsenic, and (nitrogen, phosphorus) is nitrogen. That is, the first photoactive subcell layer 22 preferably is of the general form GaInAsN. The first photoactive subcell layer 22 is sensitive to a first-photoactive-subcell-layer wavelength. (As used herein, "wavelength" may mean a single discrete wavelength, or, more commonly, "wavelength" may include a range of wavelengths at which the layer material achieves a good photoconversion efficiency.) More details of the preferred form of the first photoactive subcell layer 22 will be presented subsequently.

The multijunction solar cell 20 further includes a substrate 24 having a substrate lattice parameter different from the first-subcell lattice parameter. The substrate 24 may be inert in the sense that it does not exhibit photoactivity or participate directly in the photoconversion process. The substrate 24 may instead be a second photoactive subcell layer having a second-subcell lattice parameter different from the first-subcell lattice parameter and sensitive to a second-photoactive-subcell-layer wavelength. The preferred substrate 24 for practicing the present invention is germanium (Ge).

The multijunction solar cell 20 further includes a composition-graded buffer layer 26 between the first photoactive subcell layer 22 and the substrate 24. The composition-graded buffer layer has a buffer-layer lattice parameter graded (varied) between the first-subcell lattice parameter and the substrate lattice parameter. That is, the lattice parameter of the composition-graded buffer layer 26 is equal to or substantially equal to that of the substrate 24 where the composition-graded buffer layer 26 contacts the substrate 24, and is equal to or substantially equal to that of the first photoactive subcell layer 22 where they the composition-graded buffer layer 26 contacts the first photoactive subcell layer 22.

There must be an epitaxial relation between the subcells in order to ensure minimal interfacial defects and stresses/strains at the junctions. That is, the crystal structure types of each pair of contacting layers must be substantially the same. The lattice parameters of the contacting layers should be about the same, although there may be some lattice mismatch while still retaining the epitaxial relation due to the straining of the contacting layers. The lattice parameter of each layer is a function of its composition when in the unstrained state. The lattice parameter as a function of composition is known, or may be measured or calculated for candidate materials.

In the usual approach to prior multijunction solar cells of the type discussed herein, this epitaxial-relation requirement means that the composition of the first photoactive subcell layer would otherwise be constrained to values that would allow exact or almost exact lattice-parameter matching between the adjacent subcells or between the adjacent subcells and substrate.

An important feature of the present approach, on the other hand, is that the epitaxial relation is satisfied by the use of the composition-graded buffer layer 26 that extends between the first photoactive subcell layer 22 and the substrate 24. The layers other than the buffer layer (i.e., the first photoactive subcell layer 22 and the substrate 24) are no longer required to have the same or nearly the same lattice parameters at surfaces of contact. The composition of the first photoactive subcell layer 22 is therefore no longer constrained by the requirement of the epitaxial relation with the substrate 24 (which may be a second photoactive subcell layer), and may be separately optimized for optimal band gap and performance of the subcells and the overall solar cell.

Figure 2:
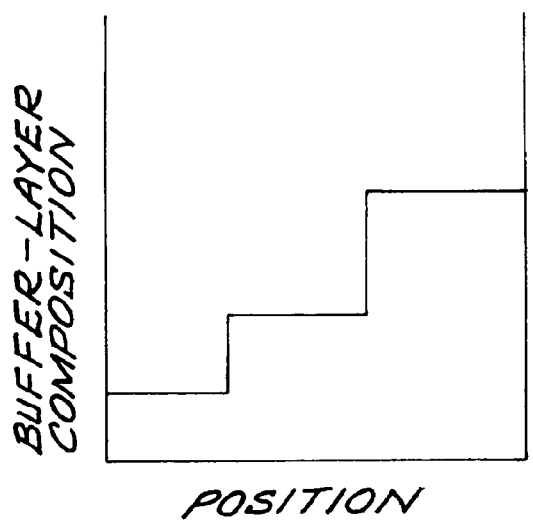
FIG. 2 is a schematic graph of composition as a function of position in a stepwise-graded buffer layer.
Figure 3:
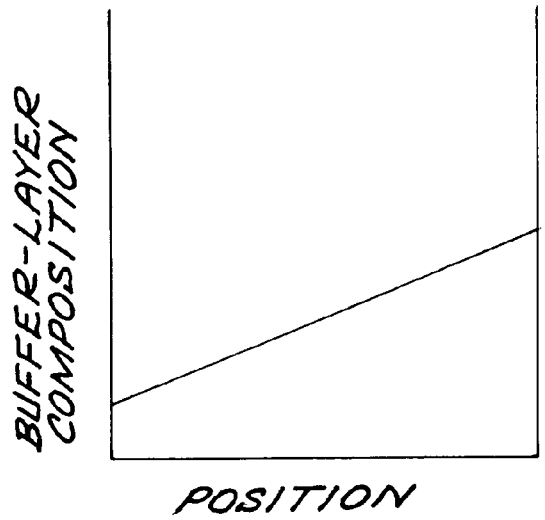
FIG. 3 is a schematic graph of composition as a function of position in a continuously graded buffer layer.

The composition-graded buffer layer 26 is not of a constant composition through its thickness, because that would produce some degree of lattice mismatching at the contact surfaces with the first photoactive subcell layer 22 and/or the substrate 24. Instead, the composition varies with position through the thickness of the composition-graded buffer layer 25. Where the composition-graded buffer layer 26 contacts the first photoactive subcell layer 22, it has the same or nearly the same (i.e., substantially the same) lattice parameter as the first photoactive subcell layer 22. Where the composition-graded buffer layer 26 contacts the substrate 24, it has the same or nearly the same (i.e., substantially the same) lattice parameter as the substrate 24, which has a lattice parameter which is different than that of the composition-graded buffer layer 26. Within the composition-graded buffer layer 26, there is an orderly, graded transition in lattice parameter from that of the substrate 24 to that of the first photoactive subcell layer 22, which is achieved with an orderly transition in the composition of the composition-graded buffer layer 26. FIGS. 2 and 3 illustrate, by way of example, two possible grading approaches for the composition of the buffer layer 26. In FIG. 2, the composition is graded in a stepwise fashion. In FIG. 3, the composition is continuously graded. In layers associated with these two figures, the end-point compositions, and consequently the end-point lattice parameters, are the same. The difference is that the composition-grading, and thence the lattice-grading, is achieved in either a stepwise or a continuous fashion. The stepwise and continuous grading may be combined in practice, with some of the composition grading (and thence the lattice-parameter grading) being realized by stepwise transitions and some being realized by continuous transitions.

In the event that the substrate 24 is a second photoactive subcell layer that photoconverts at a second-photoactive-subcell-layer wavelength, and consequently contributes to the photoconversion process of the multijunction solar cell 20 and to its photoelectric output current, the composition-graded buffer layer 26 must be transparent to light of the second-photoactive-subcell-layer wavelength. If there are additional photoactive subcells below the composition-graded buffer layer 26, the composition-graded buffer layer 26 must be transparent to the wavelengths of all of these underlying photoactive subcells as well. Following the usual convention, the sunlight is presumed to enter at the top surface of the solar cell, so that "below" means that the remaining components of the solar radiation must pass through the composition-graded buffer layer 25 before reaching the underlying subcells.

As discussed earlier, the preferred first photosensitive subcell layer 22 is of the GaInAsN composition class, and the preferred substrate 24 is Ge. The preferred composition-graded buffer layer 26 is selected so that its composition is capable of being varied over a range to achieve lattice-parameter matching of these layers 22 and 24, and it otherwise meets the above-indicated requirements. The selected preferred composition-graded buffer layer 26 for this circumstance is gallium indium arsenide (GaInAs). There is no fixed composition grading for the composition-graded buffer layer 26. Although the lattice parameter of the Ge substrate is fixed, the composition, and thence the lattice parameter, of the GaInAsN subcell layer 22 is selectable in the manner discussed next.

For the preferred approach, the first photoactive subcell layer 22 has a composition comprising gallium, indium, arsenic, and nitrogen, wherein indium is present in the first photoactive subcell layer in an amount greater than 7 atom percent and less than 32 atom percent, and nitrogen is present in the first photoactive subcell layer in an amount greater than 0 and less than 2.5 atom percent. Stated alternatively for a preferred composition, the first photoactive subcell layer 22 has a composition $Ga_{1-\%In}In_{\%In}As_{1-\%N}N_{\%N}$, wherein % In is greater than 7 atom percent and less than 32 atom percent, and % N is greater than 0 and less than 2.5 atom percent, and wherein % In and % N are associated with the same lattice parameter of the $Ga_{1-\%In}In_{\%In}As_{1-\%N}N_{\%N}$ when separately present in $Ga_{1-\%In}In_{\%In}As_{1-\%N}N_{\%N}$. In a more-general form, the first photoactive subcell layer 22 has a composition $(GrIII)_{1-X}(In)_X(GrV)_{1-Y}N_Y$, wherein X is greater than 7 atom percent and less than 32 atom percent, and Y is greater than 0 and less than 2.5 atom percent. X and Y are associated with the same lattice parameter of the $(GrIII)_{1-X}In_X(GrIV)_{1-Y}N_Y$ composition when separately present in $(GrIII)_{1-X}In_X(GrIV)_{1-Y}N_Y$, and wherein GrIII is a group III element and GrV is a group V element.

Figure 4:
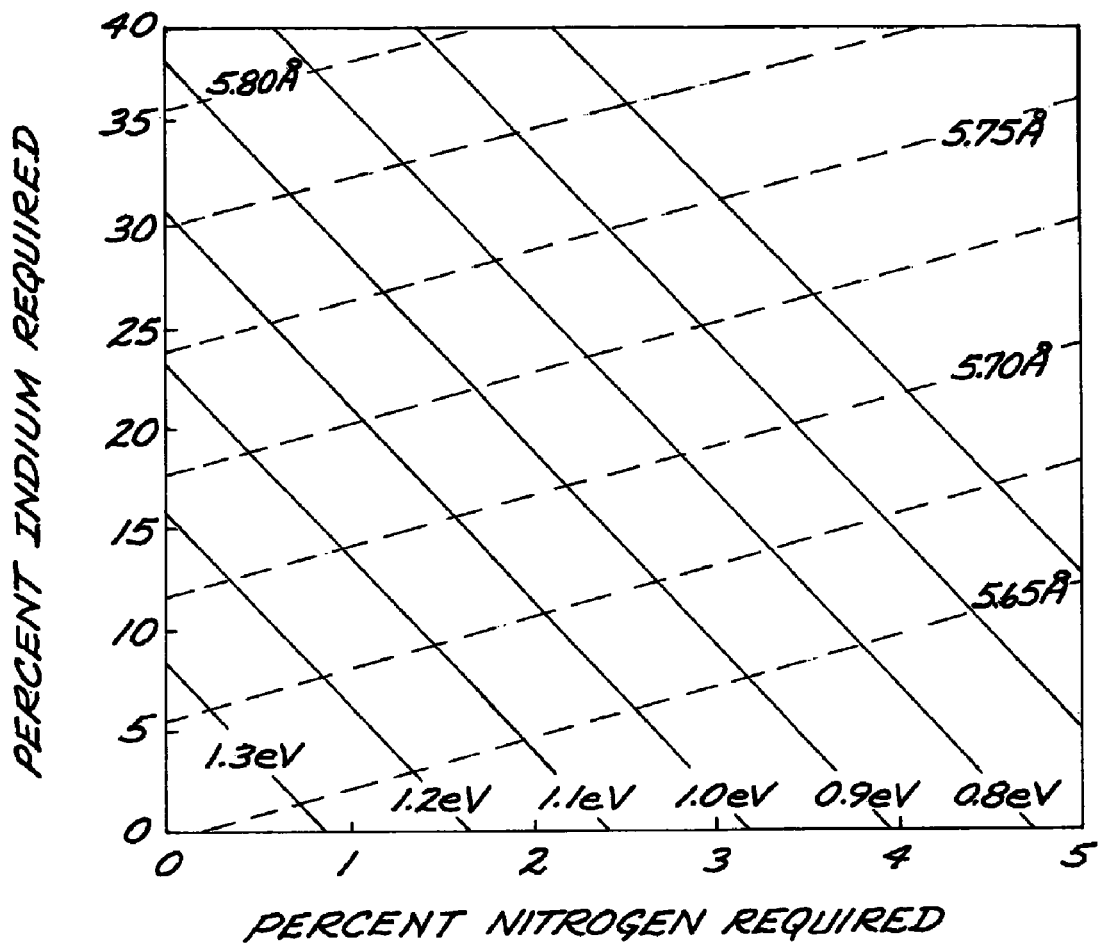
FIG. 4 is a graph of calculated lattice parameter and band gap as a function of nitrogen and indium contents for a preferred embodiment.

FIG. 4 is a graph of the calculated interrelation between the concentrations of indium and nitrogen in a GaInAsN material and the band gap and the lattice parameter of the resulting alloy. The interrelations may be represented as $$\% In(a_0, E_g) = \alpha_{In} a_0 + \beta_{In} E_g + \gamma_{In}$$

$$\% N(a_0, E_g) = \alpha_N a_0 + \beta_N E_g + \gamma_N$$

where % In and % N are in percentages, $a_0$ is in Angstroms, and $E_g$ is in electron volts. The coefficients for GaInAsN are $\alpha_{In}=192.72$, $\beta_{In}=-15.41$, $\gamma_{In}=-1067.60$, $\alpha_N=-20.21$, $\beta_N=-6.12$, $\gamma_N=122.88$. Similar pairs of equations may be written for other alloys of dilute nitride materials that cover the 1.4 eV to 0.7 eV band gap, such as InAsN, GaAsSbN, GaInAsSbN, GaInPSb, GaInAsPN, and AlGaInAsN. Examples of non-nitride mismatched 1.0 eV materials that may be described in the same manner, and are included within the scope of the present approach, include GaInAsBi, GaInAsSb, GaInAsP, $ZnGeAs_2$, and BGaInAs.

These two interrelations may be jointly depicted on a single graph, FIG. 4. To read the graph of FIG. 4, a desired lattice parameter, given by the dashed lines in 0.025 Angstrom (A) increments, is selected. The selected lattice parameter line is followed to a solid band gap line expressing the desired band gap in electron volts (eV). From the intersection between the desired lattice parameter line and the desired band gap line, the required percent indium and the required percent nitrogen are read from the axes of the graph. These values are those that describe the specific compositions $Ga_{1-\%In}In_{\%In}As_{1-\%N}N_{\%N}$. Similar graphs may be developed for other types of subcells.

Figure 5:
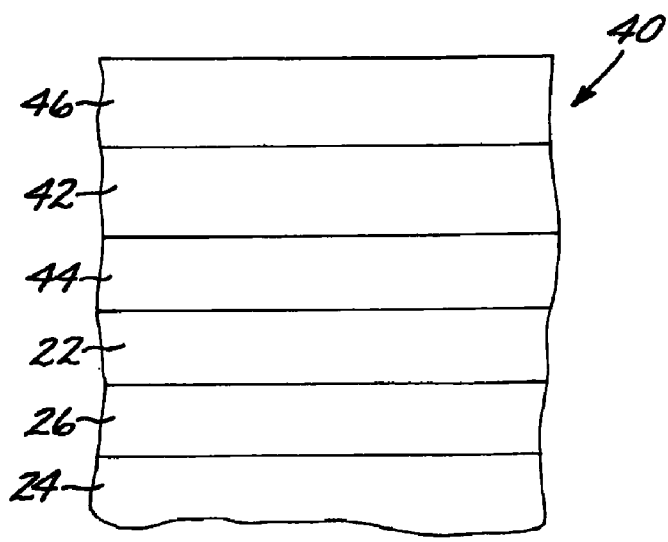
FIG. 5 is a schematic elevational view of a second embodiment of the multijunction solar cell of the present invention.

The approach discussed above is operable for a two-junction solar cell, but its greatest benefits are realized where there is at least one additional photoactive subcell layer overlying the first photoactive subcell layer 22. FIG. 5 depicts a multijunction solar cell 40 having the first photoactive subcell layer 22, the substrate 24, which in this case is a photoactive subcell, and the composition-graded buffer layer 26 as described above, and the above description is incorporated here. Additionally, there is a third photoactive subcell layer 42, and a second composition-graded buffer layer 44 extending between the third-photoactive subcell layer 42 and the first photoactive subcell layer 22. The same composition grading principles discussed in relation to the composition-graded buffer layer 26 are applicable to the second composition-graded buffer layer 44, except that its composition is graded to produce the necessary grading in the lattice parameter between the third-photoactive subcell layer 42 and the first photoactive subcell layer 22. These layers 22, 24, 26, 42, and 44 would, if no other layers were present, define a three-junction (3J) multijunction solar cell 40 (if the substrate 24 is a photoactive junction).

Additionally, in the depicted multijunction solar cell 40, there is a fourth photoactive subcell layer 46 in contact with the third-photoactive subcell layer 42. In this illustrative case, the subcell layers 42 and 46 have sufficiently well matched lattice parameters that no intermediate buffer layer, composition graded or otherwise, is needed. The layers 22, 24, 26, 42, 44, and 46 together define a four-junction (4J) solar cell. Additional junctions may be added as appropriate.

In a preferred version of the 4J solar cell, the layers include the photoactive Ge substrate 24, the composition-graded buffer layer 26 comprising GaInAs overlying and contacting the Ge substrate 24, the lattice-mismatched first photoactive subcell layer 22 comprising GaInAsN overlying and contacting the composition-graded buffer layer 26, the second composition-graded buffer layer 44 comprising GaInAs overlying and contacting the lattice-mismatched layer 22, the third photoactive subcell layer 42 comprising Ga(In)As overlying and contacting the second composition-graded buffer layer 44, and the fourth photosensitive subcell layer 46 comprising GaInP overlying and contacting the third photoactive subcell layer 42.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:
1. A multijunction solar cell comprising:
   a first photoactive subcell layer having a first-subcell lattice parameter and a composition comprising
      a material selected from the group consisting of GaInAsBi and nitrogen, ZnGeAs2 and nitrogen, and BGaInAs and nitrogen;
   a substrate having a substrate lattice parameter different from the first-subcell lattice parameter; and a composition-graded buffer layer between the first photoactive subcell layer and the substrate and having a buffer-layer lattice parameter graded between the first subcell lattice parameter and the substrate lattice parameter.

2. The multijunction solar cell of claim 1, wherein the first photoactive subcell layer has a bandgap of from about 0.7 to about 1.4 eV.

3. The multijunction solar cell of claim 1, wherein the composition of the composition-graded buffer layer is, at least in part, stepwise graded.

4. The multijunction solar cell of claim 1, wherein the composition of the composition-graded buffer layer is, at least in part, continuously graded.

5. The multijunction solar cell of claim 1, wherein the substrate is a second photoactive subcell layer having a second-subcell lattice parameter different from the first-subcell lattice parameter and sensitive to a second-photoactive-subcell-layer wavelength, and wherein the buffer layer is transparent to light of the second-photoactive-subcell-layer wavelength.

6. The multijunction solar cell of claim 1, further including at least one additional photoactive subcell layer overlying the first photoactive subcell layer.

7. A multijunction solar cell comprising:
   a first photoactive subcell layer having a first-subcell lattice parameter and a composition comprising gallium, indium, arsenic, boron or bismuth, and nitrogen, and boron or bismuth and wherein the first photoactive subcell layer has a bandgap of from about 0.7 to about 1.4 eV;
   a substrate having a substrate lattice parameter different from the first-subcell lattice parameter; and
   a composition-graded buffer layer disposed between and contacting each of the first photoactive subcell layer and the substrate and having a buffer-layer lattice parameter graded between the first-subcell lattice parameter and the substrate lattice parameter.

8. The multijunction solar cell of claim 7, wherein the first photoactive subcell layer has a bandgap of from about 0.9 to about 1.1 eV.

9. The multijunction solar cell of claim 7, wherein the composition of the composition-graded buffer layer is, at least in part, stepwise graded.

10. The multijunction solar cell of claim 7, wherein the composition of the composition-graded buffer layer is, at least in part, continuously graded.

11. The multijunction solar cell of claim 7, wherein the substrate is a second photoactive subcell layer having a second-subcell lattice parameter different from the first-subcell lattice parameter and sensitive to a second-photoactive-subcell-layer wavelength, and wherein the buffer layer is transparent to light of the second-photoactive-subcell-layer wavelength.

12. The multijunction solar cell of claim 7, further including at least one additional photoactive subcell layer overlying the first photoactive subcell layer.

13. A multijunction solar cell comprising:
   a Ge substrate;
   a composition-graded buffer layer comprising GaInAs overlying and contacting the Ge substrate;
   a lattice-mismatched layer consisting of GaInAsBi and nitrogen, ZnGeAs2 and nitrogen, and BGaInAs and nitrogen;
   a composition-graded buffer layer comprising GaInAs overlying and contacting the lattice-mismatched layer;
   a layer comprising Ga(In)As overlying and contacting the composition-graded buffer layer comprising GaInAs; and
   a layer comprising GaInP overlying and contacting the layer comprising Ga(In)As;
   wherein the Ge substrate has a substrate lattice parameter different from the lattice-mismatched layer.

14. The multijunction solar cell of claim 1, wherein the composition-graded buffer layer is in contact with each of the first photoactive subcell layer and the substrate.

* * * * *